(12) United States Patent
Miyoshi (10) Patent No.: US 6,479,369 B1
(45) Date of Patent: Nov. 12, 2002

(54) SHALLOW TRENCH ISOLATION (STI) AND METHOD OF FORMING THE SAME

(75) Inventor: Kousuke Miyoshi, Tokyo (JP)

(73) Assignee: NEC Corporation, Tokyo (JP)

( * ) Notice: Subject to any disclaimer, the term of this patent is extended or adjusted under 35 U.S.C. 154(b) by 22 days.

(21) Appl. No.: 09/705,782

(22) Filed: Nov. 6, 2000

(30) Foreign Application Priority Data

Nov. 8, 1999 (JP) ............................................ 11-316500

(51) Int. Cl.$^7$ .................. H01L 21/76; H01L 21/8242; H01L 21/336; H01L 21/311
(52) U.S. Cl. .................. 438/435; 438/248; 438/295; 438/424; 438/426; 438/702
(58) Field of Search .................. 438/248, 296, 438/294, 295, 400, 424, 425, 426, 435, 694, 696, 697, 699, 700, 702, 703, 761

(56) References Cited

U.S. PATENT DOCUMENTS

| | | | | |
|---|---|---|---|---|
| 6,020,251 A | * | 2/2000 | Peng et al. ................. | 438/296 |
| 6,165,854 A | * | 12/2000 | Wu ............................. | 438/296 |
| 6,190,995 B1 | * | 2/2001 | Wu et al. .................... | 438/400 |
| 6,204,147 B1 | * | 3/2001 | Liu et al. .................... | 438/296 |
| 6,331,472 B1 | * | 12/2001 | Liu et al. .................... | 257/510 |
| 2001/0034138 A1 | * | 10/2001 | Yamashita et al. .......... | 438/716 |

OTHER PUBLICATIONS

Chen et al., "A Novel 0.25 um Shallow Trench Isolation Technology", IEDM Tech. Digest, 1996, pp. 32.5.1–32.5.4.
Perera et al., "Trench Isolation for 0.45 um Active Pitch and Below", IEDM TEch. Digest, 1995, pp. 28.1.1–28.1.4.
Nandakumar et al., "Shallow Trench Isolation for Advanced ULSI CMOS Technologies", 1998, pp. 6.1.1–6.1.4.
Fazan et al., "A Highly Manufacturable Trench Isolation Process for Deep Submicron DRAMs", 1993, pp. 3.6.1–3.6.4.
Yeh et al., "A Novel Shallow Trench Isolation with Mini–Spacer Technology", 1998, International Conference on Solid State Devices and Materials, Hiroshima, Japan, pp. 98–99.
Park et al., "Self–Aligned LOCOS/Trench (SALOT) Combination Isolation Technology Planarized by Chemical Mechanical Polishing", IEDM Tech Digest, 1994, pp. 28.2.1–28.2.4.
Chatterjee et al., "A Shallow Trench Isolation Using LOCOS Edge for Preventing Corner Effects for 0.25/0.18 um CMOS Technologies and Beyond", IEDM Tech. Digest, 1996, pp. 32.3.1–32.3.4.
Yamazaki et al., "Optimized Shallow Trench Isolation Technology for DRAM Embedded Logic Process", 1999, International Conference on Solid State Devices and Materials, Tokyo, Japan, pp. 18–19.

* cited by examiner

*Primary Examiner*—Richard Elms
*Assistant Examiner*—Adam Pyonin
(74) *Attorney, Agent, or Firm*—McGinn & Gibb, PLLC (57) ABSTRACT

A method of forming a shallow trench isolation, includes the steps, in sequence, of (a) forming a mask pattern on a silicon substrate, the mask pattern being made of a silicon dioxide layer and a silicon nitride layer, (b) forming a trench in the silicon substrate with the mask pattern being used as a mask, (c) forming a first silicon dioxide film covering an inner surface of the trench such that the trench is not filled with the first silicon dioxide film, (d) heating the first silicon dioxide film, (e) forming a second silicon dioxide film over a product resulted from the step (d) such that the trench is filled with the second silicon dioxide film, (f) heating the second silicon dioxide film, (g) polishing the first and second silicon dioxide films through the use of the silicon nitride layer as a stopper, (h) etching the silicon nitride layer for removal, and (i) etching the first and second silicon dioxide films such that the first and second silicon dioxide films are on a level with a surface of the silicon substrate.

43 Claims, 8 Drawing Sheets

SHALLOW TRENCH ISOLATION (STI) AND METHOD OF FORMING THE SAME

BACKGROUND OF THE INVENTION

1. Field of the Invention

The invention relates to a shallow trench isolation (STI) in a semiconductor substrate and a method of forming the same, and more particularly to a shallow trench isolation where recesses are not formed at a surface of an oxide film filled in a trench formed in a semiconductor substrate, and method of forming such a shallow trench isolation.

2. Description of the Related Art

When devices formed on a semiconductor substrate have to be electrically isolated from one another, those skilled in the art often select shallow trench isolation (hereinbelow, referred so simply as "STI") where a trench is formed at a surface of a semiconductor substrate and the trench is filled with an insulating film.

FIGS. 1A to 1G are cross-sectional views of STI fabricated by a conventional method.

Figure 1A:
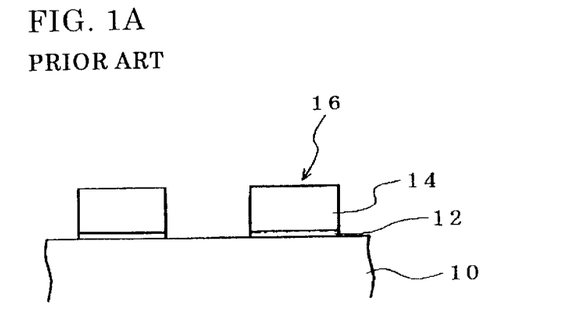
FIGS. 1A to 1G are cross-sectional views of a shallow trench isolation, illustrating respective steps of a conventional method of fabricating the same.

First, as illustrated in FIG. 1A, a trench mask pattern 16 comprised of a silicon dioxide film 12 formed by thermal oxidation and a silicon nitride film 14 is formed on a semiconductor substrate such as a silicon substrate 10.

Figure 1B:
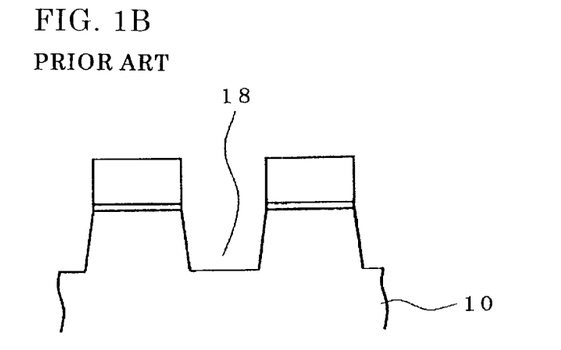

Then, as illustrated in FIG. 1B, the silicon substrate 10 is etched by dry etching through the use of the mask pattern 16 to thereby form a trench 18.

Figure 1C:
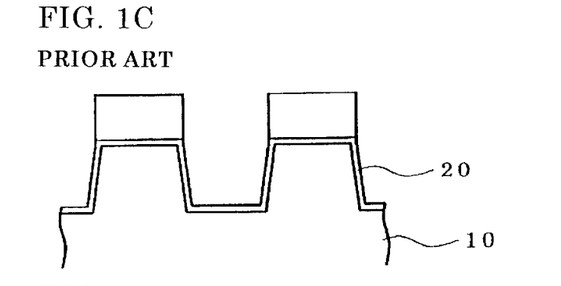

Then, as illustrated in FIG. 1C, the silicon substrate 10 is thermally oxidized to thereby form a silicon dioxide film 20 covering a bottom and a sidewall of the trench 18.

Figure 1D:
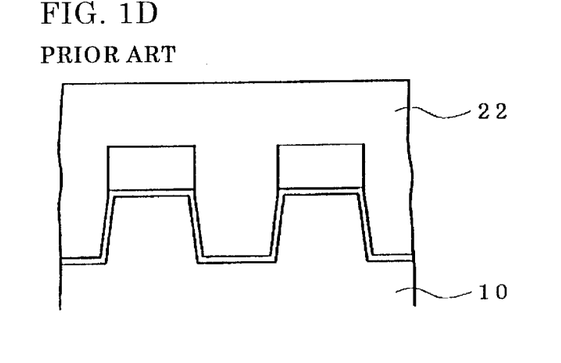

Then, as illustrated in FIG. 1D, a silicon dioxide film 22 is formed over the product illustrated in FIG. 1C such that the trench 18 is entirely filled with the silicon dioxide film 22.

Figure 1E:
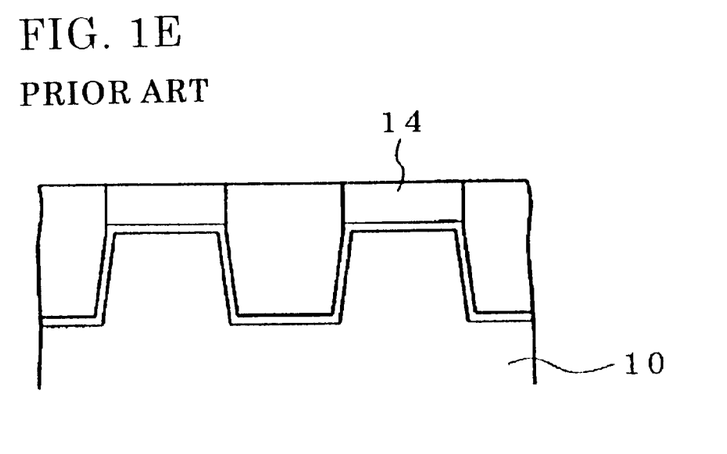

Then, as illustrated in FIG. 1E, the silicon dioxide film 22 is polished by chemical mechanical polishing (CMP) until the silicon nitride film 14 appears. That is, the silicon nitride film 14 is used as a polishing stopper.

Figure 1F:
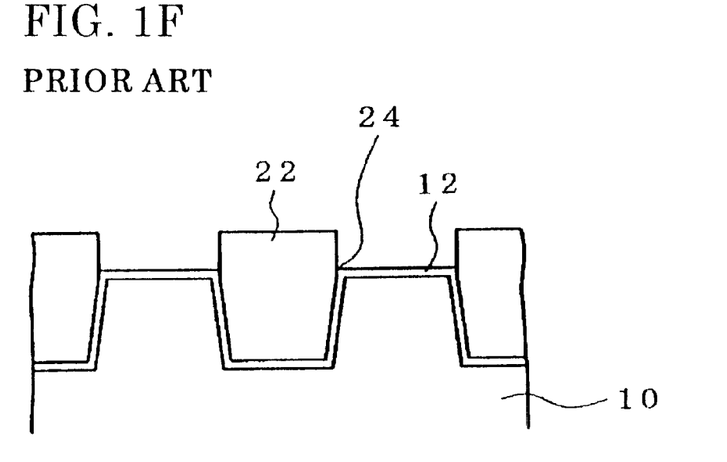

Then, as illustrated in FIG. 1F, the silicon nitride film 14 is removed by wet etching.

Figure 1G:
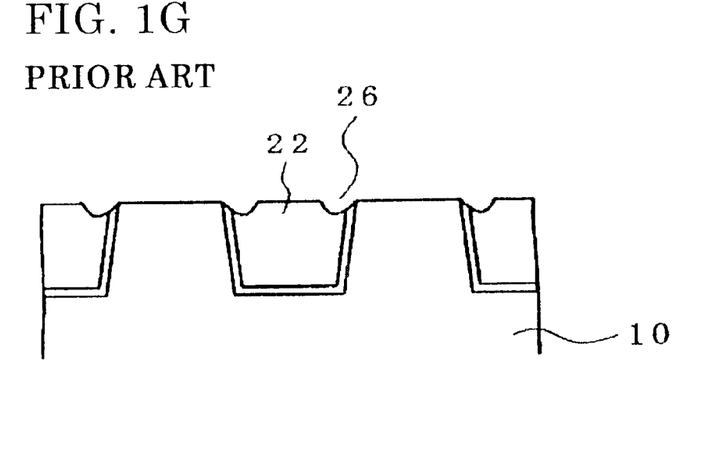

Then, as illustrated in FIG. 1G, the silicon dioxide film 12 and a portion of the silicon dioxide film 22 are removed by wet etching such that the silicon dioxide film 22 is on a level with the silicon substrate 10.

Thus, there is completed STI wherein the trench is filled with the silicon dioxide film 22.

Since the wet etching is isotropically carried out in the step illustrated in FIG. 1G, a portion 24 (see FIG. 1F) at which a sidewall of the silicon dioxide film 22 meets the silicon dioxide film 12 is most aggressively etched. As a result, as illustrated in FIG. 1G, recesses 26 are formed at a surface of the silicon dioxide film 22 filling the trench 28 therewith.

For instance, when the silicon dioxide film 22 has a depth in the range of 300 to 400 nm, the recesses 26 would have a depth of about 50 nm.

In the above-mentioned conventional method of fabricating STI, it is unavoidable that the recesses 26 are formed at a surface of the silicon dioxide film 22 filling the trench 18 therewith. The recesses 26 cause a problem as follows.

It is assumed that MOSFET is fabricated on the silicon substrate 10. If a gate electrode of MOSFET is formed on STI, the recess 26 creates regions of high electric field at corners of the recess 26, and hence, a threshold voltage at the corners of the recess 26 is reduced. This results in hump or kink phenomenon in the Id-Vg characteristic of MOSFET, further resulting in poor performance of MOSFET.

Such a problem as mentioned above is indicated in the following documents, for instance:

(A) C. Chen et al., 1996 IEDM Tech. Digest, pp 837–840;
(B) H. Perera et al., 1995 IEDM Tech. Digest, pp 679–682; and
(C) M. Nandakumar et al., 1998 IEDM Tech. Digest, pp 133–136.

In addition, if the recesses 26 had an extremely great depth, etching residue would remain when a gate electrode is etched, resulting in a problem of shortcircuit between gate wirings.

Many attempts have been made to fabricate STI where recesses are not formed at a surface of a silicon dioxide film filling a trench therewith.

For instance, a method in which a silicon dioxide film filling a trench therewith is T-shaped such that ends of the silicon dioxide film are located outside a trench has been suggested in the following documents:

(A) P. C. Fazan et al., 1993 IEDM Tech. Digest, pp 57–60;
(B) W. K. Yeh et al., 1998 SSDM, pp 98–99;
(C) T. Park et al., 1996 IEDM Tech. Digest, pp 675–678;
(D) A. Chatterjee et al., 1996 IEDM Tech. Digest, pp 829–832; and
(E) T. Yamazaki et al., 1999 SSDM, pp 18–19.

A method in which a trench is formed after a gate electrode has been formed is suggested in the following document:

(F) C. Chen et al., 1996 IEDM Tech. Digest, pp 837–840.

However, it is not always possible even by the above-mentioned methods to perfectly prevent formation of the recesses 26 at a surface of the silicon dioxide film 22.

In the conventional method of fabricating STI, having been explained with reference to FIGS. 1A to 1G, the silicon dioxide film 22 illustrated in FIG. 1D may be thermally annealed at a temperature equal to or greater than 1000 degrees centigrade to densify the silicon dioxide film 22 in order to enhance a resistance of the silicon dioxide film 22 against wet etching, or reduce an etching rate of the silicon dioxide film 22 for preventing the formation of the recesses 26.

However, if the silicon dioxide film 22 were thermally annealed, the silicon dioxide film 22 would be contracted, resulting in that stresses are generated in the silicon substrate 10, and hence, crystal defects are generated. If the silicon dioxide film 22 were thermally annealed at about 800 degrees centigrade so that small stresses are generated in the silicon substrate 10, it would be impossible to enhance a resistance of the silicon dioxide film 22 to etching.

SUMMARY OF THE INVENTION

In view of the above-mentioned problems in the conventional methods, it is an object of the present invention to provide a method of fabricating a shallow trench isolation which is capable of preventing the formation of recesses at a surface of an oxide film filling a trench therewith, and further preventing generation of stresses in a semiconductor substrate.

It is also an object of the present invention to provide a shallow trench isolation which is capable of doing the same.

In one aspect, there is provided a method of forming a shallow trench isolation, including the steps, in sequence, of (a) forming a trench in a semiconductor substrate, (b) forming a first oxide film covering an inner surface of the trench such that the trench is not filled with the first oxide film, (c) heating the first oxide film, (d) forming a second oxide film over a product resulted from the step (c) such that the trench is filled with the second oxide film, and (e) etching the first and second oxide films such that the first and second oxide films are on a level with a surface of the semiconductor substrate.

In accordance with the present invention, an oxide film filling a trench therewith is designed to have a two-layered structure including the first oxide film and the second oxide film. The first oxide film is designed to have such a thickness that a trench is not filled with the first oxide film. That is, the first oxide film is formed in the step (b) to have a thickness smaller than a half of a width of the trench. The first oxide film is then heated to be densified and have an enhanced resistance to etching. Though the first oxide film is contracted in the heating step (c), a contract stress is absorbed into the first oxide film, because a space exists adjacent to the first oxide film in the trench. Hence, there is not generated a stress in the semiconductor substrate.

It is preferable that the first oxide film is heated in the step (c) at a temperature equal to or greater than 900 degrees centigrade in order to enhance a resistance of the first oxide film to etching. It is also preferable that the first oxide film is heated in the step (c) at a temperature equal to or smaller than 1200 degrees centigrade in order to prevent curvature of the semiconductor substrate.

Then, the second oxide film is formed over the first oxide film in the step (d) such that the trench is filled with the second oxide film. Then, the first and second oxide films are etched in the step (e) such that the first and second oxide films are on a level with a surface of the semiconductor substrate. Since the first oxide film has a smaller etching rate than an etching rate of the semiconductor substrate, a portion at which a sidewall of the first oxide film meets a surface of the semiconductor substrate is slowly etched. Accordingly, unlike the conventional method illustrated in FIGS. 1A to 1G, recesses are not formed at a surface of the second oxide film.

For instance, the first and second silicon dioxide films may be comprised of a high-density plasma chemical vapor deposition (HDP-CVD) film, a tetraethylorthosilicate non-doped silicate glass (TEOSNSG) film, a $O_3$-TEOSNSG film, a high temperature oxide (HTO) film, or a spin on glass (SOG) film.

In particular, a HDP-CVD film is a most preferable film because it has a smallest etching rate among the above-mentioned films. Since other films such as a TEOSNSG film have a high etching rate in as-depo condition, when the first and second oxide films are comprised of such other films, it would be necessary to heat the second oxide film as well as the first oxide film in order to reduce an etching rate of the second oxide film to prevent formation of recesses at a surface of the second oxide film.

It is preferable that the method further includes the step of (f) forming a third oxide film covering a bottom and a sidewall of the trench therewith, the step (f) being to be carried out between the steps (a) and (b), and that the method still further includes the step of (g) forming a nitride film covering the third oxide film thereover, the step (g) being to be carried out between the steps (f) and (b).

The third oxide film and the nitride film prevent the semiconductor substrate from being oxidized around the trench, when the first oxide film is heated. This ensures that the first oxide film may be heated for a longer time, and may be heated at a temperature higher than a temperature at which the first oxide film is heated without the nitride film being formed.

There is further provided a method of forming a shallow trench isolation, including the steps, in sequence, of (a) forming a trench in a semiconductor substrate, (b) forming a first oxide film covering an inner surface of the trench such that the trench is not filled with the first oxide film, (c) heating the first oxide film, (d) forming a second oxide film over a product resulted from the step (c) such that the trench is filled with the second oxide film, (e) heating the second oxide film, and (f) etching the first and second oxide films such that the first and second oxide films are on a level with a surface of the semiconductor substrate.

It is preferable that the second oxide film is heated in the step (e) at a temperature in the range of 900 to 1200 degrees centigrade both inclusive, in which case it is preferable that the second oxide film is heated in the step (e) at a temperature smaller than a temperature at which the first oxide film is heated.

There is still further provided a method of forming a shallow trench isolation, including the steps, in sequence, of (a) forming a mask pattern on a semiconductor substrate, the mask pattern being comprised of an oxide layer and a nitride layer, (b) forming a trench in the semiconductor substrate with the mask pattern being used as a mask, (c) forming a first oxide film covering an inner surface of the trench such that the trench is not filled with the first oxide film, (d) heating the first oxide film, (e) forming a second oxide film over a product resulted from the step (d) such that the trench is filled with the second oxide film, (f) polishing the first and second oxide films through the use of the nitride layer as a stopper, (g) etching the nitride layer for removal, and (h) etching the first and second oxide films such that the first and second oxide films are on a level with a surface of the semiconductor substrate.

There is yet further provided a method of forming a shallow trench isolation, including the steps, in sequence, of (a) forming a mask pattern on a semiconductor substrate, the mask pattern being comprised of an oxide layer and a nitride layer, (b) forming a trench in the semiconductor substrate with the mask pattern being used as a mask, (c) forming a first oxide film covering an inner surface of the trench such that the trench is not filled with the first oxide film, (d) heating the first oxide film, (e) forming a second oxide film over a product resulted from the step (d) such that the trench is filled with the second oxide film, (f) heating the second oxide film, (g) polishing the first and second oxide films through the use of the nitride layer as a stopper, (h) etching the nitride layer for removal, and (i) etching the first and second oxide films such that the first and second oxide films are on a level with a surface of the semiconductor substrate.

There is still yet further provided a method of forming a shallow trench isolation, including the steps, in sequence, of (a) forming a mask pattern on a silicon substrate, the mask pattern being comprised of a silicon dioxide layer and a silicon nitride layer, (b) forming a trench in the silicon substrate with the mask pattern being used as a mask, (c) forming a first silicon dioxide film covering an inner surface of the trench such that the trench is not filled with the first silicon dioxide film, (d) heating the first silicon dioxide film, (e) forming a second silicon dioxide film over a product resulted from the step (d) such that the trench is filled with the second silicon dioxide film, (f) polishing the first and second silicon dioxide films through the use of the silicon nitride layer as a stopper, (g) etching the silicon nitride layer for removal, and (h) etching the first and second silicon dioxide films such that the first and second silicon dioxide films are on a level with a surface of the silicon substrate.

There is further provided a method of forming a shallow trench isolation, including the steps, in sequence, of (a) forming a mask pattern on a silicon substrate, the mask pattern being comprised of a silicon dioxide layer and a silicon nitride layer, (b) forming a trench in the silicon substrate with the mask pattern being used as a mask, (c) forming a first silicon dioxide film covering an inner surface of the trench such that the trench is not filled with the first silicon dioxide film, (d) heating the first silicon dioxide film, (e) forming a second silicon dioxide film over a product resulted from the step (d) such that the trench is filled with the second silicon dioxide film, (f) heating the second silicon dioxide film, (g) polishing the first and second silicon dioxide films through the use of the silicon nitride layer as a stopper, (h) etching the silicon nitride layer for removal, and (i) etching the first and second silicon dioxide films such that the first and second silicon dioxide films are on a level with a surface of the silicon substrate.

In another aspect of the present invention, there is provided a shallow trench isolation including (a) a semiconductor substrate formed at a surface thereof with a trench, (b) a first oxide film to which a heat treatment was applied and which covers an inner surface of the trench such that the trench is not filled with the first oxide film, and (c) a second oxide film covering the first oxide film therewith such that the trench is filled with the second oxide film, the first and second oxide films being on a level with a surface of the semiconductor substrate.

For instance, the first oxide film has a thickness smaller than a half of a width of the trench.

It is preferable that the shallow trench isolation further includes a third oxide film sandwiched between an inner surface of the trench and the first oxide film.

It is also preferable that the shallow trench isolation further includes a nitride film sandwiched between the third oxide film and second oxide film.

It is also preferable that the first and second oxide films are comprised of a high-density plasma chemical vapor deposition (HDP-CVD) film, a tetraethylorthosilicate non-doped silicate glass (TEOSNSG) film, a $O_3$-TEOSNSG film, a high temperature oxide (HTO) film, or a spin on glass (SOG) film.

For instance, the semiconductor substrate is a silicon substrate, the first oxide film is a silicon dioxide film, the second oxide film is a silicon dioxide film, the third oxide film is a silicon dioxide film, and the nitride film is a silicon nitride film.

There is further provided a shallow trench isolation including (a) a semiconductor substrate formed at a surface thereof with a trench, (b) a first oxide film to which a heat treatment was applied and which covers an inner surface of the trench such that the trench is not filled with the first oxide film, and (c) a second oxide film to which a heat treatment was applied and which covers the first oxide film therewith such that the trench is filled with the second oxide film, the first and second oxide films being on a level with a surface of the semiconductor substrate.

The advantages obtained by the aforementioned present invention will be described hereinbelow.

In accordance with the present invention, recesses are not formed at a surface of an oxide film filling a trench therewith. Hence, it is possible to prevent deterioration in performances of a device, caused by the recesses, and also prevent generation of a stress in the semiconductor substrate.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

First Embodiment

FIGS. 2A to 2I are cross-sectional views of a shallow trench isolation, illustrating respective steps of a method of fabricating the same, in accordance with the first embodiment.

Figure 2A:
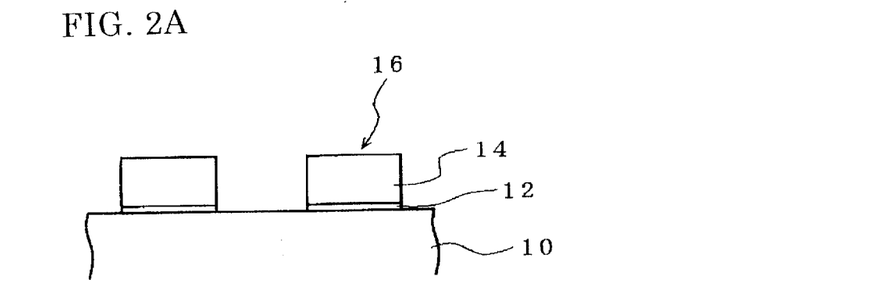
FIGS. 2A to 2I are cross-sectional views of a shallow trench isolation, illustrating respective steps of a method of fabricating the same, in accordance with the first embodiment.

First, as illustrated in FIG. 2A, a trench mask pattern 16 comprised of a first silicon dioxide film 12 and a silicon nitride film 14 is formed on a silicon substrate 10. The first silicon dioxide film 12 has a thickness of about 15 nm and the silicon nitride film 14 has a thickness of about 150 nm.

Figure 2B:
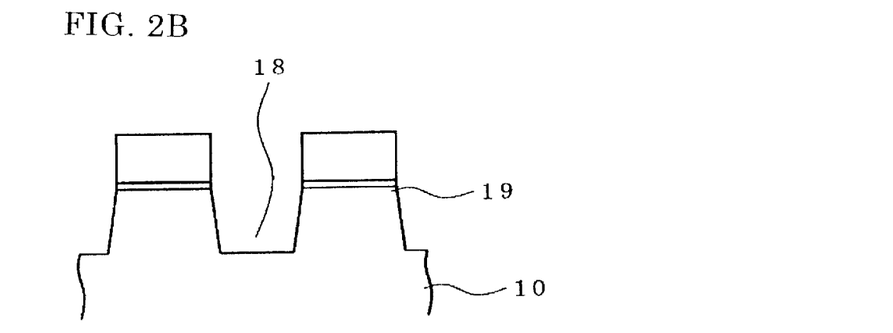

Then, as illustrated in FIG. 2B, the silicon substrate 10 is etched by dry etching through the use of the mask pattern 16 to thereby form a trench 18. The thus formed trench 18 has a depth of about 300 nm.

Figure 2C:
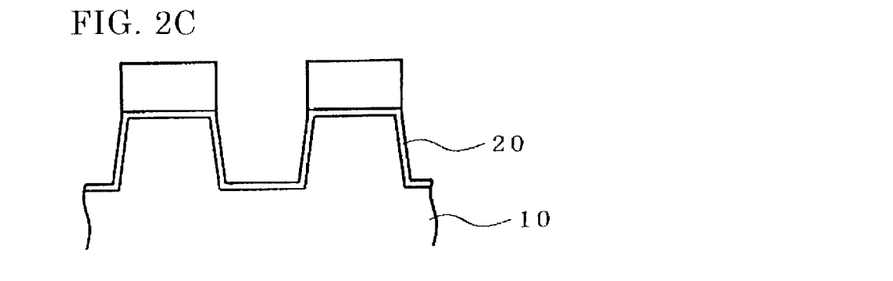

Then, as illustrated in FIG. 2C, the silicon substrate 10 is thermally oxidized to thereby form a second silicon dioxide film 20 covering a bottom and a sidewall of the trench 18. The thus formed second silicon dioxide film 20 has a thickness of about 15 nm.

The first purpose of forming the second silicon dioxide film 20 is to compensate for damage caused on a bottom and a sidewall of the trench 18. The second purpose is to round off upper edges 19 of the mesa-shaped silicon substrate 10 after the trench 18 has been formed, in order to avoid concentration of electric field to the upper edges 19 in the case that MOSFET is formed on the silicon substrate 10.

Figure 2D:
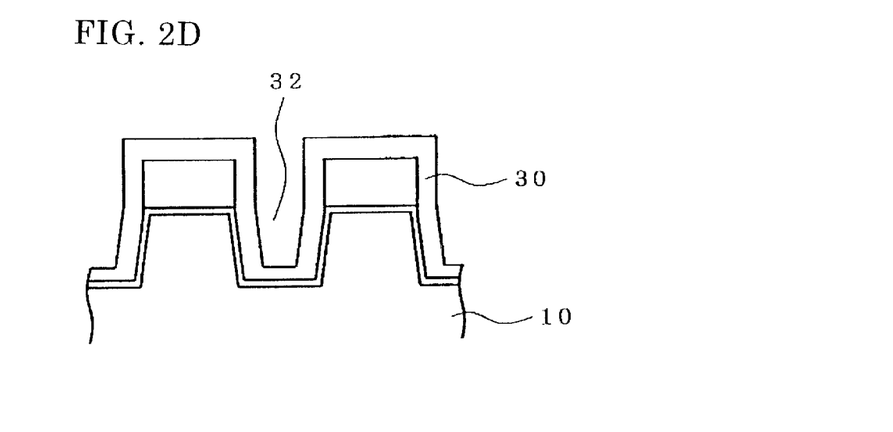

Then, as illustrated in FIG. 2D, a third silicon dioxide film 30 is formed over the silicon nitride film 14 and the second silicon dioxide film 20 by high-density plasma enhanced chemical vapor deposition (HDP-CVD) using $SiH_4$ gas. Herein, the third silicon dioxide film 30 is designed to have such a thickness that the trench 18 is not entirely filled with the third silicon dioxide film 30, that is, a space 32 exists in the trench 18.

In order to make the space 32 in the trench 18, the third silicon dioxide film 30 is designed to have a thickness equal to or smaller than a half of a width of a bottom of the trench 18. In the first embodiment, the third silicon dioxide film 30 has a thickness of about 50 nm.

Figure 2E:
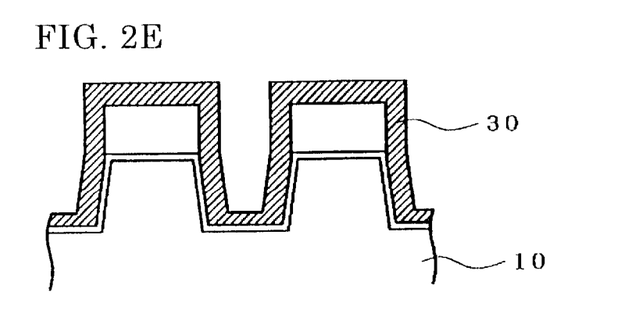

Then, as illustrated in FIG. 2E, the third silicon dioxide film 30 is heated to be densified and have an enhanced resistance to etching, that is, have a reduced etching rate.

For instance, the third silicon dioxide film 30 is heated at a temperature in the range of 900 to 1200 degrees centigrade in an oxidizing atmosphere or in a non-oxidizing atmosphere such as a $N_2$ or Ar atmosphere. For instance, the third silicon dioxide film 30 is oxidized at about 1000 degrees centigrade for 10 minutes in wet condition. As an alternative, the third silicon dioxide film 30 is annealed in a furnace at 1200 degrees centigrade for 1 hour in a $N_2$ atmosphere.

Though the third silicon dioxide film 30 is contracted while being heated, since such contraction is absorbed by the space 32, a stress would be generated in the silicon substrate 10.

A preferable range of a temperature at which the third silicon dioxide film 30 is heated is 900 to 1200 degrees centigrade. If the temperature is lower than 900 degrees centigrade, the first silicon dioxide film 30 would be sufficiently densified, and if the temperature is higher than 1200 degrees centigrade, the silicon substrate 10 might become curved.

Figure 2F:
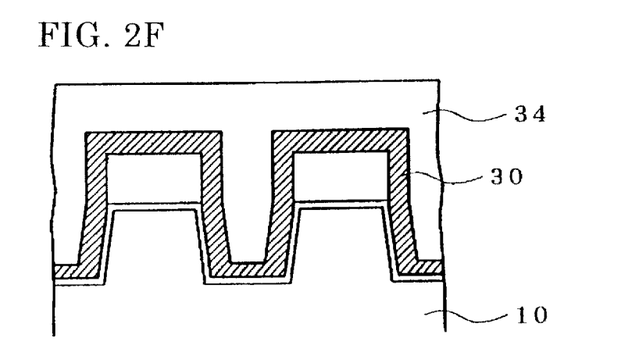

Then, as illustrated in FIG. 2F, a fourth silicon dioxide film 34 is formed entirely over the third silicon dioxide film 30 by HDP-CVD using $SiH_4$ gas such that the space 32 is entirely filled with the fourth silicon dioxide film 34. In the first embodiment, the fourth silicon dioxide film 34 has a thickness of about 400 nm.

Figure 2G:
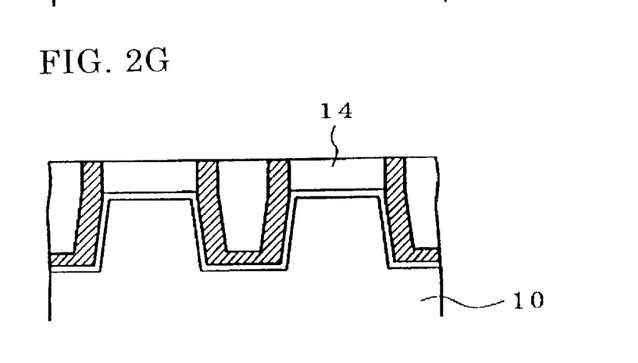

Then, as illustrated in FIG. 2G, the fourth and third silicon dioxide films 34 and 30 are polished by chemical mechanical polishing (CMP) until the silicon nitride film 14 appears. That is, the silicon nitride film 14 is used as a polishing stopper.

Figure 2H:
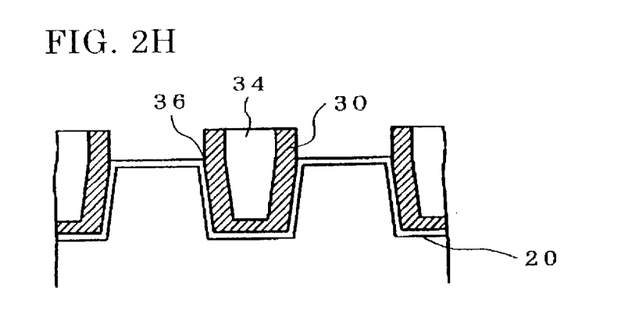

Then, as illustrated in FIG. 2H, the silicon nitride film 14 is removed by wet etching using hot phosphoric acid. At this stage, the trench 18 is filled with a two-layered structure including the third and fourth silicon dioxide films 30 and 34.

Figure 2I:
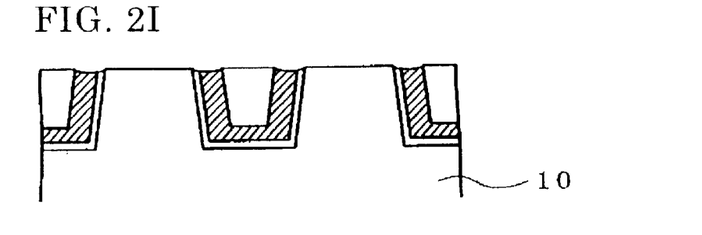

Then, as illustrated in FIG. 2I, the first silicon dioxide film 12 and a portion of the third and fourth silicon dioxide films 30 and 34 are removed by wet etching such that the third and fourth silicon dioxide films 30 and 34 are on a level with the silicon substrate 10.

Since the third silicon dioxide film 30 has a reduced etching rate as a result of the heating step illustrated in FIG. 2E, a portion 36 (see FIG. 2H) at which an upper surface of the first silicon dioxide film 12 meets a sidewall of the third silicon dioxide film 30 is slowly etched. Accordingly, recesses such as the recesses 26 illustrated in FIG. 1G are not formed at surfaces of the third and fourth silicon dioxide films 30 and 34 both filling the trench 18 therewith.

Thus, there is completed STI in accordance with the first embodiment, in which no recesses are formed at surfaces of the third and fourth silicon dioxide films 30 and 34.

For instance, when MOSFET is fabricated on a semiconductor substrate having such a shallow trench isolation as mentioned in the first embodiment, the following steps are carried out.

First, a sacrifice oxide film is formed on the semiconductor substrate. Then, ions are implanted into the semiconductor substrate to thereby form wells in the semiconductor substrate. After the sacrifice oxide film has been removed by etching, a gate oxide film is formed, and then, a polysilicon film is formed. The polysilicon film will make a gate electrode. These steps are well known to those skilled in the art.

Second Embodiment

FIGS. 3A to 3G are cross-sectional views of a shallow trench isolation, illustrating respective steps of a method of fabricating the same, in accordance with the second embodiment.

Figure 3A:
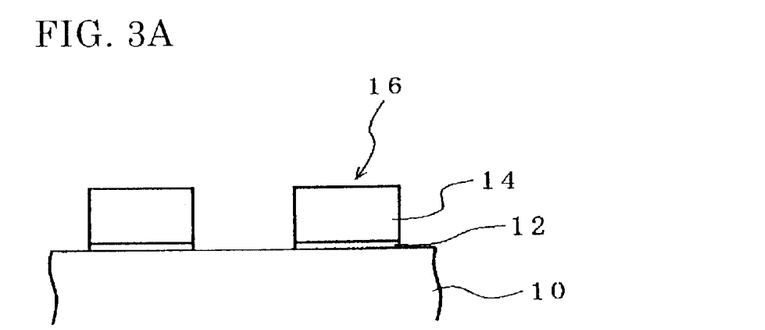
FIGS. 3A to 3G are cross-sectional views of a shallow trench isolation, illustrating respective steps of a method of fabricating the same, in accordance with the second embodiment.

First, as illustrated in FIG. 3A, a trench mask pattern 16 comprised of a first silicon dioxide film 12 and a silicon nitride film 14 is formed on a silicon substrate 10. The first silicon dioxide film 12 has a thickness of about 15 nm and the silicon nitride film 14 has a thickness of about 150 nm.

Figure 3B:
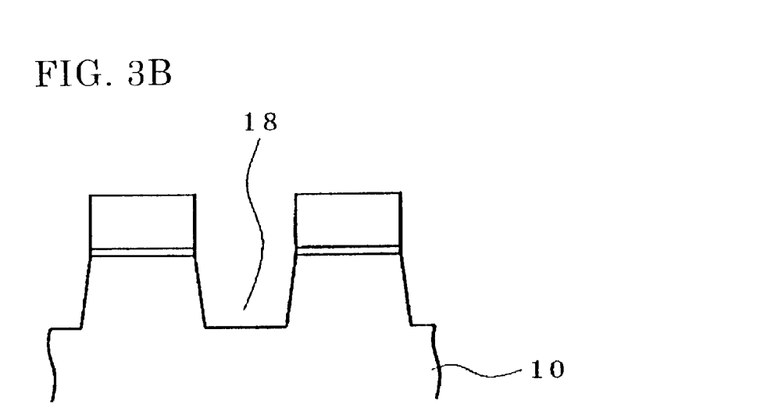

Then, as illustrated in FIG. 3B, the silicon substrate 10 is etched by dry etching through the use of the mask pattern 16 to thereby form a trench 18. The thus formed trench 18 has a depth of about 300 nm.

Figure 3C:
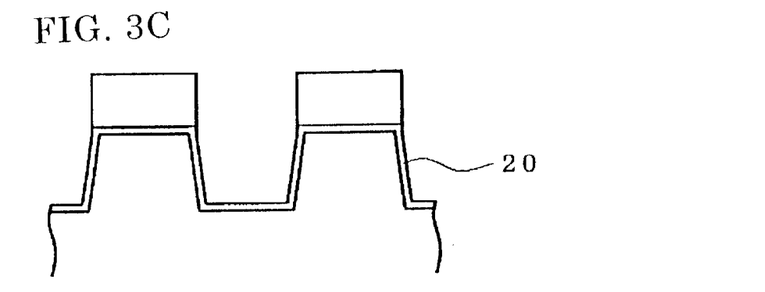

Then, as illustrated in FIG. 3C, the silicon substrate 10 is thermally oxidized to thereby form a second silicon dioxide film 20 covering a bottom and a sidewall of the trench 18. The thus formed second silicon dioxide film 20 has a thickness of about 15 nm.

Figure 3D:
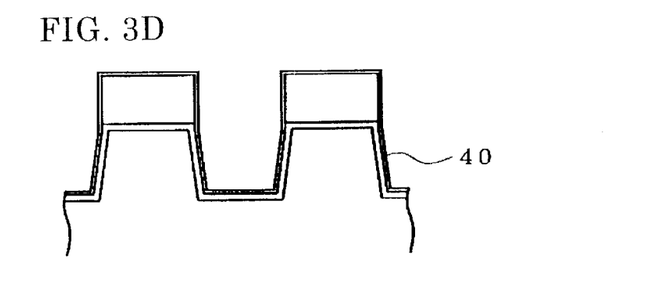

Then, as illustrated in FIG. 3D, a second silicon nitride film 40 is formed entirely over the silicon nitride film 14 and the second silicon dioxide film 20. The second silicon nitride film 40 has a thickness of about 5 nm.

Figure 3E:
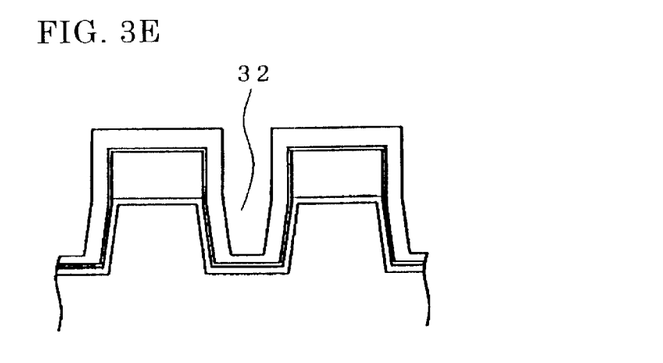

Then, as illustrated in FIG. 3E, a third silicon dioxide film 30 is formed over the second silicon nitride film 40 by high-density plasma enhanced chemical vapor deposition (HDP-CVD) using $SiH_4$ gas. Herein, the third silicon dioxide film 30 is designed to have such a thickness that the trench 18 is not entirely filled with the third silicon dioxide film 30, that is, a space 32 exists in the trench 18.

In order to make the space 32 in the trench 18, the third silicon dioxide film 30 is designed to have a thickness equal to or smaller than a half of a width of a bottom of the trench 18. In the second embodiment, the third silicon dioxide film 30 has a thickness of about 50 nm.

Figure 3F:
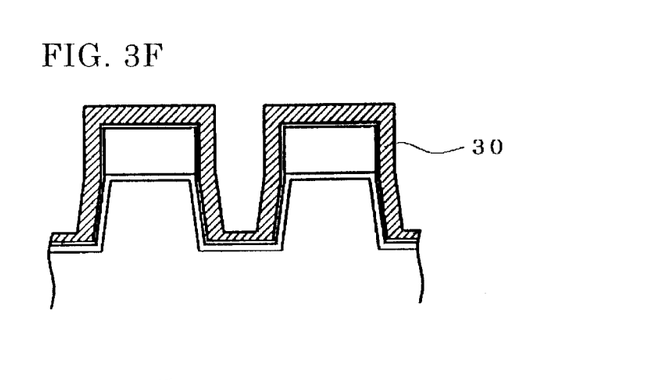

Then, as illustrated in FIG. 3F, the third silicon dioxide film 30 is oxidized at about 1200 degrees centigrade for 5 minutes in wet condition to thereby densify the third silicon dioxide film 30.

The third silicon dioxide film 30 can he heated at a temperature higher than a temperature at which the third silicon dioxide film 30 in the first embodiment is heated. This is because the second silicon dioxide film 40 prevents an inner surface of the trench 18 from being further oxidized.

Figure 3G:
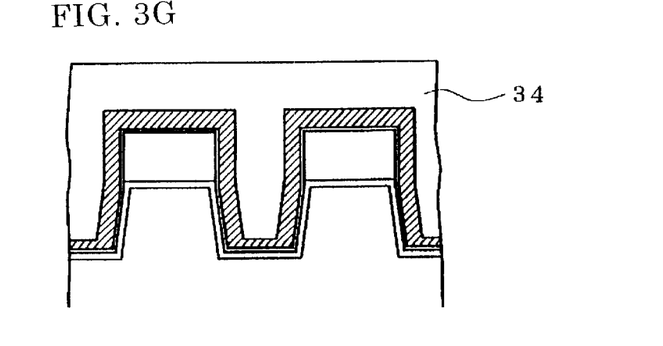

Then, as illustrated in FIG. 3G, a fourth silicon dioxide film 34 is formed entirely over the third silicon dioxide film 30 by HDP-CVD using $SiH_4$ gas such that the space 32 is entirely filled with the fourth silicon dioxide film 34. In the second embodiment, the fourth silicon dioxide film 34 has a thickness of about 400 nm.

The steps to be carried out hereinafter are the same as the steps carried out in the first embodiment.

Third Embodiment

In the third embodiment explained hereinbelow, films filling a trench therewith are composed of LP-TEOSNSG (low pressure tetraethylorthosilicate non-doped silicate glass). Since LP-TEOSNSG films or SOG films have a high etching rate, it might be extremely etched, and resultingly, recesses might be formed at a surface thereof. In order to prevent the formation of such recesses, the LP-TEOSNSG film is necessary to be heated to be densified, or to have a reduced etching rate. A secondly formed LP-TEOSNSG film is heated at a temperature smaller than a temperature at which a firstly formed LP-TEOSNSG film is to be heated.

The steps having been explained with reference to FIGS. 2A to 2C are carried out also in the third embodiment.

Figure 4A:
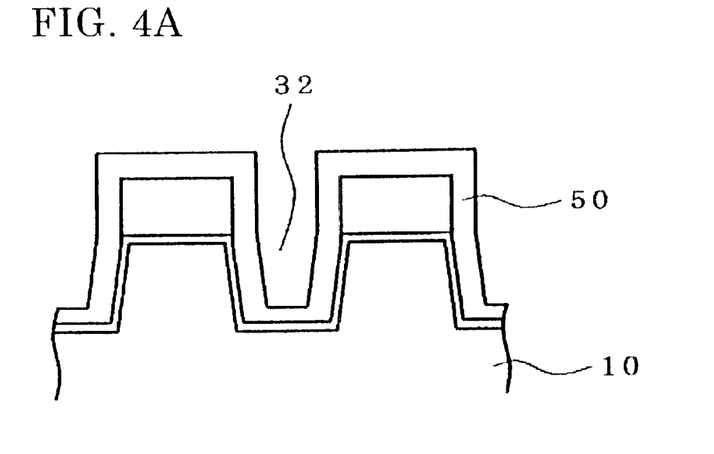
FIGS. 4A to 4G are cross-sectional views of a shallow trench isolation, illustrating respective steps of a method of fabricating the same, in accordance with the third embodiment.

Then, as illustrated in FIG. 4A, a first LP-TEOSNSG film 50 as a third silicon dioxide film is formed over the silicon nitride film 14 and the second silicon dioxide film 20 at 700 degrees centigrade by low pressure enhanced chemical vapor deposition (LP-CVD) using TEOS gas. The first LP-TEOSNSG film 50 is designed to have such a thickness that the trench 18 is not entirely filled with the first LP-TEOSNSG film 50, that is, the space 32 exists in the trench 18.

In the third embodiment, the first LP-TEOSNSG film 50 has a thickness of about 50 nm.

Figure 4B:
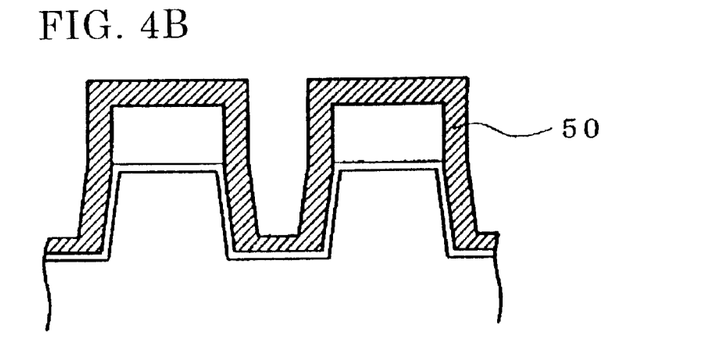

Then, as illustrated in FIG. 4B, the first LP-TEOSNSG film 50 is oxidized at about 1000 degrees centigrade for 10 minutes in wet condition. As an alternative, the first LP-TEOSNSG film 50 is annealed in a furnace at 1200 degrees centigrade for 1 hour in a $N_2$ atmosphere. As a result, the first LP-TEOSNSG film 50 is densified.

Figure 4C:
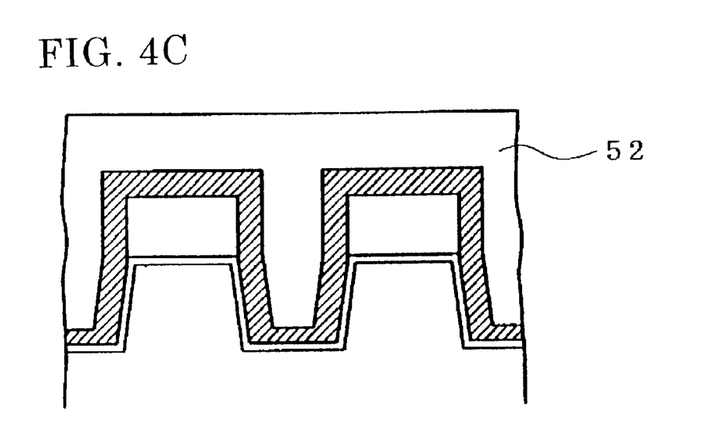

Then, as illustrated in FIG. 4C, a second LP-TEOSNSG film 52 is formed entirely over the first LP-TEOSNSG film 50 at 700 degrees centigrade by LP-CVD using TEOS gas such that the space 32 is entirely filled with the second LP-TEOSNSG film 52. In the third embodiment, the second LP-TEOSNSG film 52 has a thickness of about 400 nm.

Figure 4D:
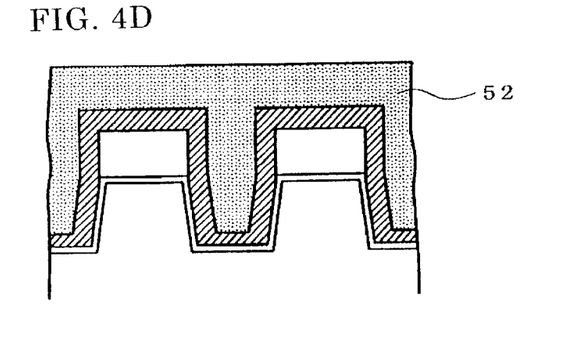

Then, as illustrated in FIG. 4D, the second LP-TEOSNSG film 52 is annealed in a furnace at about 850 degrees centigrade for 30 minutes in a $N_2$ atmosphere. As a result, the second LP-TEOSNSG film 52 is densified, and hence, has a reduced etching rate.

Figure 4E:
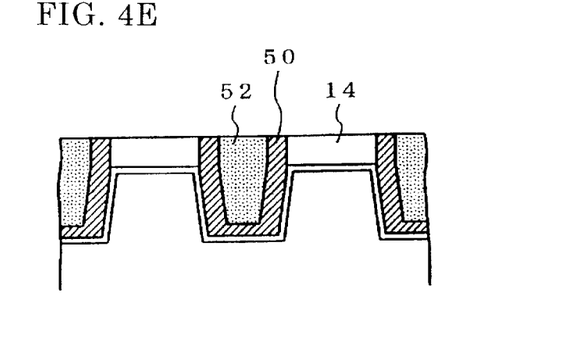

Then, as illustrated in FIG. 4E, the first and second LP-TEOSNSG films 50 and 52 are polished by chemical mechanical polishing (CMP) until the silicon nitride film 14 appears. That is, the silicon nitride film 14 is used as a polishing stopper.

Figure 4F:
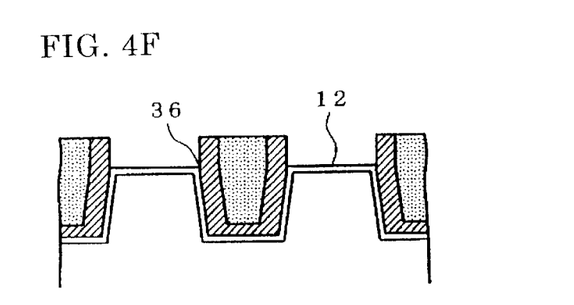

Then, as illustrated in FIG. 4F, the silicon nitride film 14 is removed by wet etching using hot phosphoric acid. At this stage, the trench 18 is filled with a two-layered structure including the first and second LP-TEOSNSG films 50 and 52.

Figure 4G:
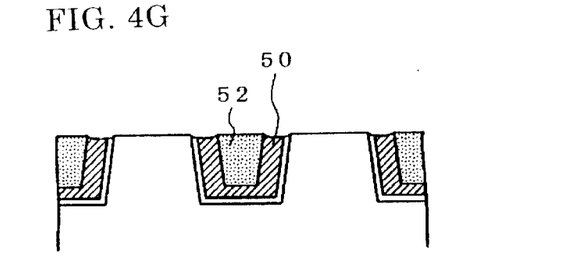

Then, as illustrated in FIG. 4G, the first silicon dioxide film 12 and a portion of the first and second LP-TEOSNSG films 50 and 52 are removed by wet etching such that the first and second LP-TEOSNSG films 50 and 52 are on a level with the silicon substrate 10.

Since the first LP-TEOSNSG film 50 has a reduced etching rate as a result of the heating step illustrated in FIG. 4B, an edge portion 36 (see FIG. 4F) at which an upper surface of the first silicon dioxide film 12 meets a sidewall of the first LP-TEOSNSG film 50 is slowly etched. Accordingly, recesses such as the recesses 26 illustrated in FIG. 1G are not formed at a surface of the first LP-TEOSNSG film 50.

In addition, since the second LP-TEOSNSG film 52 has a reduced etching rate as a result of the heating step illustrated in FIG. 4D, recesses such as the recesses 26 illustrated in FIG. 1G are not formed at a surface of the second LP-TEOSNSG film 52.

Thus, there is completed STI in accordance with the third embodiment, in which no recesses are formed at surfaces of the first and second LP-TEOSNSG films 50 and 52.

In the third embodiment, a silicon nitride film such as the silicon nitride film 40 illustrated in FIG. 3D may be formed covering the second silicon dioxide film 20 therewith in the trench 18.

Though the silicon substrate 10 is used in the above-mentioned first to third embodiments, other semiconductor substrates such as a GaAs substrate may be used instead, in which case, the second silicon dioxide film 20 is formed by CVD.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-316500 filed on Nov. 8, 1999 including specification, claims, drawings and summary is incorporated herein by reference in its entirety.

What is claimed is:

1. A method of forming a shallow trench isolation, comprising:

forming a trench in a semiconductor substrate;

forming a first oxide film covering an inner surface of said trench such that said trench is not filled with said first oxide film;

heating said first oxide film;

forming a second oxide film over a product resulted from said heating said first oxide film such that said trench is filled with said second oxide film; and etching said first and second oxide films such that an upper surface of each of said first and second oxide films is coplanar with an upper surface of said semiconductor substrate, wherein said product resulting from said heating said first oxide film has an etching rate which is different than an etching rate of said second oxide film.

2. The method as set forth in claim 1, wherein said heating said first oxide film comprises heating said first oxide film at a temperature in the range of 900 to 1200 degrees centigrade both inclusive.

3. The method as set forth in claim 1, wherein said forming said first oxide film comprises forming said first oxide film to have a thickness smaller than a half of a width of said trench.

4. The method as set forth in claim 1, further comprising:

forming a third oxide film covering a bottom and a sidewall of said trench therewith, carried out between said forming said trench and said forming said first oxide film.

5. The method as set forth in claim 4, further comprising:

forming a nitride film covering said third oxide film thereover, carried out between said forming said third oxide film and said forming said first oxide film.

6. The method as set forth in claim 1, wherein said first and second oxide films comprise at least one of a high-density plasma chemical vapor deposition (HDP-CVD) film, a tetraethylorthosilicate non-doped silicate glass (TEOSNSG) film, a $O_3$-TEOSNSG film, a high temperature oxide (HTO) film, and a spin on glass (SOG) film.

7. A method of forming a shallow trench isolation, comprising:

forming a trench in a semiconductor substrate;

forming a fist oxide film covering an inner surface of said trench such that said trench is not filled with said first oxide film;

heating said first oxide film;

forming a second oxide film over a product resulted from said heating said first oxide film such that said trench is filled with said second oxide film;

heating said second oxide film; and etching said first and second oxide films such that an upper surface of each of said first and second oxide films is coplanar with an upper surface of said semiconductor substrate wherein said product resulting from said heating said first oxide film has an etching rate which is different than an etching rate of said second oxide film.

8. The method as set forth in claim 7, wherein said heating said first oxide film comprises heating said first oxide film at a temperature in the range of 900 to 1200 degrees centigrade both inclusive.

9. The method as set forth in claim 7, wherein said heating said second oxide film comprises heating said second oxide film at a temperature in the range of 900 to 1200 degrees centigrade both inclusive.

10. The method as set forth in claim 9, wherein said heating said second oxide film comprises heating said second oxide film at a temperature lower than a temperature at which said first oxide film is heated.

11. The method as set forth in claim 7, wherein said forming said first oxide film comprises forming said first oxide film to have a thickness smaller than a half of a width of said trench.

12. The method as set forth in claim 7, further comprising;

forming a third oxide film covering a bottom and a sidewall of said trench therewith, carried out between said forming a trench and said forming a first oxide layer.

13. The method as set forth in claim 12, further comprising:

forming a nitride film covering said third oxide film thereover, carried out between said forming a third oxide film and said forming said first oxide film.

14. The method as set forth in claim 7, wherein said first and second oxide films comprise at least one of a high-density plasma chemical vapor deposition (HDP-CVD) film, a tetraethylorthosilicate non-doped silicate glass (TEOSNSG) film, a $O_3$-TEOSNSG film, a high temperature oxide (HTO) film, and a spin on glass (SOG) film.

15. A method of forming a shallow trench isolation, comprising:

forming a mask pattern on a semiconductor substrate, said mask pattern being comprised of an oxide layer and a nitride layer;

forming a trench in said semiconductor substrate with said mask pattern being used as a mask;

forming a first oxide film covering an inner surface of said trench such that said trench is not filled with said first oxide film;

heating said first oxide film;

forming a second oxide film over a product resulted from said heating said first oxide film such that said trench is filled with said second oxide film;

polishing said first and second oxide films through the use of said nitride layer as a stopper;

etching said nitride layer for removal; and etching said first and second oxide films such that an upper surface of each of said first and second oxide films is coplanar with an upper surface of said semiconductor substrate, wherein said product resulting from said heating said first oxide film has an etching rate which is different than an etching rate of said second oxide film.

16. The method as set forth in claim 15, wherein said heating said first oxide film comprises heating said first oxide film at a temperature in the range of 900 to 1200 degrees centigrade both inclusive.

17. The method as set forth in claim 15, wherein said forming said first oxide film comprises forming said first oxide film to have a thickness smaller than a half of a width of said trench.

18. The method as set forth in claim 15, further comprising:

forming a third oxide film covering a bottom and a sidewall of said trench therewith, carried out between said forming said trench and said forming said first oxide film.

19. The method as set forth in claim 18, further comprising:

forming a nitride film covering said third oxide film thereover, carried out between said forming said third oxide film and said forming said first oxide film.

20. The method as set forth in claim 15, wherein said first and second oxide films comprise at least one of a high-density plasma chemical vapor deposition (HDP-CVD) film, a tetraethylorthosilicate non-doped silicate glass (TEOSNSG) film, a $O_3$-TEOSNSG film, a high temperature oxide (HTO) film, and a spin on glass (SOG) film.

21. A method of forming a shallow trench isolation, comprising:

forming a mask pattern on a semiconductor substrate, said mask pattern being comprised of an oxide layer and a nitride layer;

forming a trench in said semiconductor substrate with said mask pattern being used as a mask;

forming a first oxide film covering an inner surface of said trench such that said trench is not filled with said first oxide film;

heating said first oxide film;

forming a second oxide film over a product resulted from said heating said first oxide film such that said trench is filled with said second oxide film;

heating said second oxide film;

polishing said first and second oxide films through the use of said nitride layer as a stopper;

etching said nitride layer for removal; and etching said first and second oxide films such that an upper surface of each of said first and second oxide films is coplanar with an upper surface of said semiconductor substrate, wherein said product resulting from said heating said first oxide film has an etching rate which is different than an etching rate of said second oxide film.

22. The method as set forth in claim 21, wherein said heating said first oxide film comprises heating said first oxide film at a temperature in the range of 900 to 1200 degrees centigrade both inclusive.

23. The method as set forth in claim 21, wherein said heating said second oxide film comprises heating said second oxide film at a temperature in the range of 900 to 1200 degrees centigrade both inclusive.

24. The method as set forth in claim 23, wherein said heating said second oxide film comprises heating said second oxide film at a temperature lower than a temperature at which said first oxide film is heated.

25. The method as set forth in claim 21, wherein said forming said first oxide film comprises forming said first oxide film to have a thickness smaller than a half of a width of said trench.

26. The method as set forth in claim 21, further comprising:
   forming a third oxide film covering a bottom and a sidewall of said trench therewith, carried out between said forming said trench and forming said first oxide film.

27. The method as set forth in claim 26, further comprising:
   forming a nitride film covering said third oxide film thereover, carried out between said forming said third oxide film and said forming said first oxide film.

28. The method as set forth in claim 21, wherein said first and second oxide films comprise at least one of a high-density plasma chemical vapor deposition (HDP-CVD) film, a tetraethylorthosilicate non-doped silicate glass (TEOSNSG) film, a O$_3$-TEOSNSG film, a high temperature oxide (HTO) film, and a spin on glass (SOG) film.

29. A method of forming a shallow trench isolation, comprising:
   forming a mask pattern on a silicon substrate, said mask pattern being comprised of a silicon dioxide layer and a silicon nitride layer;
   forming a trench in said silicon substrate with said mask pattern being used as a mask;
   forming a first silicon dioxide film covering an inner surface of said trench such that said trench is not filled with said first silicon dioxide film;
   heating said first silicon dioxide film;
   forming a second silicon dioxide film over a product resulted from said heating said first silicon dioxide film such that said trench is filled with said second silicon dioxide film;
   polishing said first and second silicon dioxide films through the use of said silicon nitride layer as a stopper;
   etching said silicon nitride layer for removal; and
   etching said first and second silicon dioxide films such that an upper surface of each of said first and second silicon dioxide films is coplanar with an upper surface of said silicon substrate,
   wherein said product resulting from said heating said first silicon dioxide film has an etching rate which is different than an etching rate of said second silicon dioxide film.

30. The method as set forth in claim 29, wherein said heating said first silicon dioxide film comprises heating said first silicon dioxide film at a temperature in the range of 900 to 1200 degrees centigrade both inclusive.

31. The method as set forth in claim 29, wherein said forming said first silicon dioxide film comprises forming said first silicon dioxide film to have a thickness smaller than a half of a width of said trench.

32. The method as set forth in claim 29, further comprising:
   forming a third silicon dioxide film covering a bottom and a sidewall of said trench therewith, carried out between said forming said trench and forming said first silicon dioxide film.

33. The method as set forth in claim 32, further comprising:
   forming a silicon nitride film covering said third silicon dioxide film thereover, carried out between said forming said third silicon dioxide film and forming said first silicon dioxide film.

34. The method as set forth in claim 29, wherein said first and second silicon dioxide films are formed by high-density plasma chemical vapor deposition (HDP-CVD).

35. The method as set forth in claim 29, wherein said first and second silicon dioxide films comprise at least one of a high-density plasma chemical vapor deposition (HDP-CVD) film, a tetraethylorthosilicate non-doped silicate glass (TEOSNSG) film, a O$_3$-TEOSNSG film, a high temperature oxide (HTO) film, and a spin on glass (SOG) film.

36. A method of forming a shallow trench isolation, comprising:
   forming a mask pattern on a silicon substrate, said mask pattern being comprised of a silicon dioxide layer and a silicon nitride layer;
   forming a trench in said silicon substrate with said mask pattern being used as a mask;
   forming a first silicon dioxide film covering an inner surface of said trench such that said trench is not filled with said first silicon dioxide film;
   heating said first silicon dioxide film;
   forming a second silicon dioxide film over a product resulted from said heating said first silicon dioxide film such that said trench is filled with said second silicon dioxide film;
   heating said second silicon dioxide film;
   polishing said first and second silicon dioxide films through the use of said silicon nitride layer as a stopper;
   etching said silicon nitride layer for removal; and
   etching said first and second silicon dioxide films such that an upper surface of each of said first and second silicon dioxide films is coplanar with an upper surface of said silicon substrate,
   wherein said product resulting from said heating said first silicon dioxide film has an etching rate which is different than an etching rate of said second silicon dioxide film.

37. The method as set forth in claim 36, wherein said heating said first silicon dioxide film comprises heating said first silicon dioxide film at a temperature in the range of 900 to 1200 degrees centigrade both inclusive.

38. The method as set forth in claim 36, wherein said heating said second silicon dioxide film comprises heating said second silicon dioxide film at a temperature in the range of 900 to 1200 degrees centigrade both inclusive.

39. The method as set forth in claim 38, wherein said heating said second silicon dioxide film comprises heating said second silicon dioxide film at a temperature lower than a temperature at which said first silicon dioxide film is heated.

40. The method as set forth in claim 36, wherein said forming said first silicon dioxide film comprises forming said first silicon dioxide film to have a thickness smaller than a half of a width of said trench.

41. The method as set forth in claim 36, further comprising:
   forming a third silicon dioxide film covering a bottom and a sidewall of said trench therewith, carried out between said forming said trench and forming said first silicon dioxide film.

42. The method as set forth in claim 41, further comprising:

forming a silicon nitride film covering said third silicon dioxide film thereover, carried out between forming said third silicon dioxide film and forming said first silicon dioxide film.

43. The method as set forth in claim 36, wherein said first and second silicon dioxide films comprise at least one of a high-density plasma chemical vapor deposition (HDP-CVD) film, a tetraethylorthosilicate non-doped silicate glass (TEOSNSG) film, a $O_3$-TEOSNSG film, a high temperature oxide (HTO) film, and a spin on glass (SOG) film.

* * * * *